(12) United States Patent
Lim et al.

(10) Patent No.: US 7,629,838 B2
(45) Date of Patent: Dec. 8, 2009

(54) RATIO-INDEPENDENT SWITCHED CAPACITOR AMPLIFIERS AND METHODS OF OPERATING RATIO-INDEPENDENT SWITCHED CAPACITOR AMPLIFIERS

(75) Inventors: Seung-Hyun Lim, Gyeonggi-do (KR); Jeong-Hwan Lee, Seoul (KR); Gun-Hee Han, Gyeonggi-do (KR); Seog-Heon Ham, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 44 days.

(21) Appl. No.: 11/975,018

(22) Filed: Oct. 17, 2007

(65) Prior Publication Data

US 2008/0094140 A1 Apr. 24, 2008

(30) Foreign Application Priority Data

Oct. 20, 2006 (KR) .................. 10-2006-0102565

(51) Int. Cl.
*H03F 1/02* (2006.01)
(52) U.S. Cl. .......................................... 330/9
(58) Field of Classification Search .............. 330/9, 330/124 R; 327/91, 96, 337
See application file for complete search history.

(56) References Cited

U.S. PATENT DOCUMENTS 5,574,457 A * 11/1996 Garrity et al. ............. 341/172
5,796,300 A   8/1998 Morgan
6,853,241 B2  2/2005 Fujimoto
7,030,804 B2  4/2006 Yoshioka et al. .......... 341/172
7,449,923 B2 * 11/2008 Braswell et al. .......... 327/96

FOREIGN PATENT DOCUMENTS

| JP | 09008604 | 1/1997 |
|----|----------|--------|
| JP | 2005-303427 | 10/1997 |
| JP | 2006-086981 | 3/2006 |
| KR | 1020060044441 | 5/2006 |

* cited by examiner

*Primary Examiner*—Robert Pascal
*Assistant Examiner*—Khiem D Nguyen
(74) *Attorney, Agent, or Firm*—Myers Bigel Sibley & Sajovec, P.A.

(57) ABSTRACT

A ratio-independent switched capacitor amplifier includes a first sampling circuit configured to sample a first input voltage as a first sampling voltage and to double a level of the first sampling voltage during an interval in which the first input voltage is cut off; a second sampling circuit configured to sample a second input voltage as a second sampling voltage and to double a level of the second sampling voltage during an interval in which the second input voltage is cut off; and a differential amplifier circuit configured to output a difference between the first sampling voltage and the second sampling voltage.

25 Claims, 10 Drawing Sheets

RATIO-INDEPENDENT SWITCHED CAPACITOR AMPLIFIERS AND METHODS OF OPERATING RATIO-INDEPENDENT SWITCHED CAPACITOR AMPLIFIERS

CROSS-REFERENCE TO RELATED APPLICATIONS

This U.S. non-provisional patent application claims priority under 35 U.S.C § 119 to Korean Patent Application 2006-102565 filed on Oct. 20, 2006, the disclosure of which is hereby incorporated herein by reference.

BACKGROUND

The present invention relates to switched capacitor (SC) amplifiers and, more particularly, to ratio-independent SC amplifiers capable of operating at high speeds.

A ratio-independent amplifier is used to double amplify (i.e., amplify with a gain of 2) a difference between two input signals, regardless of a mismatched capacitance ratio. For example, two capacitors in a conventional SC amplifier may be designed to have a ratio of one to one. However, it can be difficult to realize a precise capacitance ratio of one to one due to errors in device tolerances. As a result, a conventional SC amplifier may not output an amplified signal having a precise gain. Accordingly, a ratio-independent SC amplifier scheme provides a circuit that may be capable of outputting an amplified signal with a double gain despite device tolerances.

A ratio-independent switched capacitor amplifier may be used in a circuit requiring an amplifier with a double gain. For example, in general, a cyclic analog-digital converter and/or a pipeline analog-digital converter may include an amplifier circuit. The cyclic analog-digital converter and/or pipeline analog-digital converter may use a ratio-independent switched capacitor amplifier in order to double amplify a difference between input signals.

A conventional ratio-independent switched capacitor amplifier may include an operational amplifier, a capacitor, and a feedback capacitor. Although not shown in figures, the capacitor is connected to an inverting terminal of the operation amplifier, and the feedback capacitor is connected to an output terminal of the amplifier to form a feedback loop.

A ratio-independent switched capacitor amplifier samples/charges an input voltage on a sampling capacitor at a first stage and discharges the charged voltage (or charges) of the sampling capacitor to a feedback capacitor at a second stage. That is, during the second stage, charges stored in the sampling capacitor are sent to the feedback capacitor. Afterwards, an input voltage is again charged in the sampling capacitor at a third stage, and charges stored in the sampling capacitor are discharged to the feedback capacitor at a fourth stage. In accordance with the above-described approach, a ratio-independent switched capacitor amplifier may store double charges of an input voltage in a capacitor, and as a result may have a double gain of charges in the capacitor.

A ratio-independent switched capacitor amplifier may require four stages of operation, including two sampling stages, in order to obtain a double gain. Accordingly, the conventional manner approach may have a disadvantage, in that it is may not be suitable for applications needing high-speed amplifier operation.

SUMMARY

Some embodiments of the invention provide a ratio-independent switched capacitor amplifier including a first sampling circuit configured to sample a first input voltage as a first sampling voltage and to double a level of the first sampling voltage during an interval in which the first input voltage is cut off. A second sampling circuit is configured to sample a second input voltage as a second sampling voltage and to double a level of the second sampling voltage during an interval in which the second input voltage is cut off. A differential amplifier circuit is configured to output a difference between the doubled first sampling voltage and the doubled second sampling voltage.

According to further embodiments of the invention, a method of operating a ratio-independent switched capacitor amplifier includes sampling a first input voltage as a first sampling voltage; sampling a second input voltage as a second sampling voltage; doubling a level of the first sampling voltage during an interval in which the first input voltage is cut off; doubling a level of the second sampling voltage during an interval in which the second input voltage is cut off; and outputting a difference between the first sampling voltage and the second sampling voltage.

Still other further embodiments of the invention provide methods of operating a ratio-independent switched capacitor amplifier including sampling a first input voltage as a first sampling voltage and a first inverse voltage; sampling a second input voltage as a second sampling voltage and a second inverse voltage; feeding back the first inverse voltage to double a level of the first sampling voltage during an interval in which the first input voltage is cut off; feeding back the second inverse voltage to double a level of the second sampling voltage during an interval in which the second input voltage is cut off; and outputting a difference between the first sampling voltage and the second sampling voltage.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
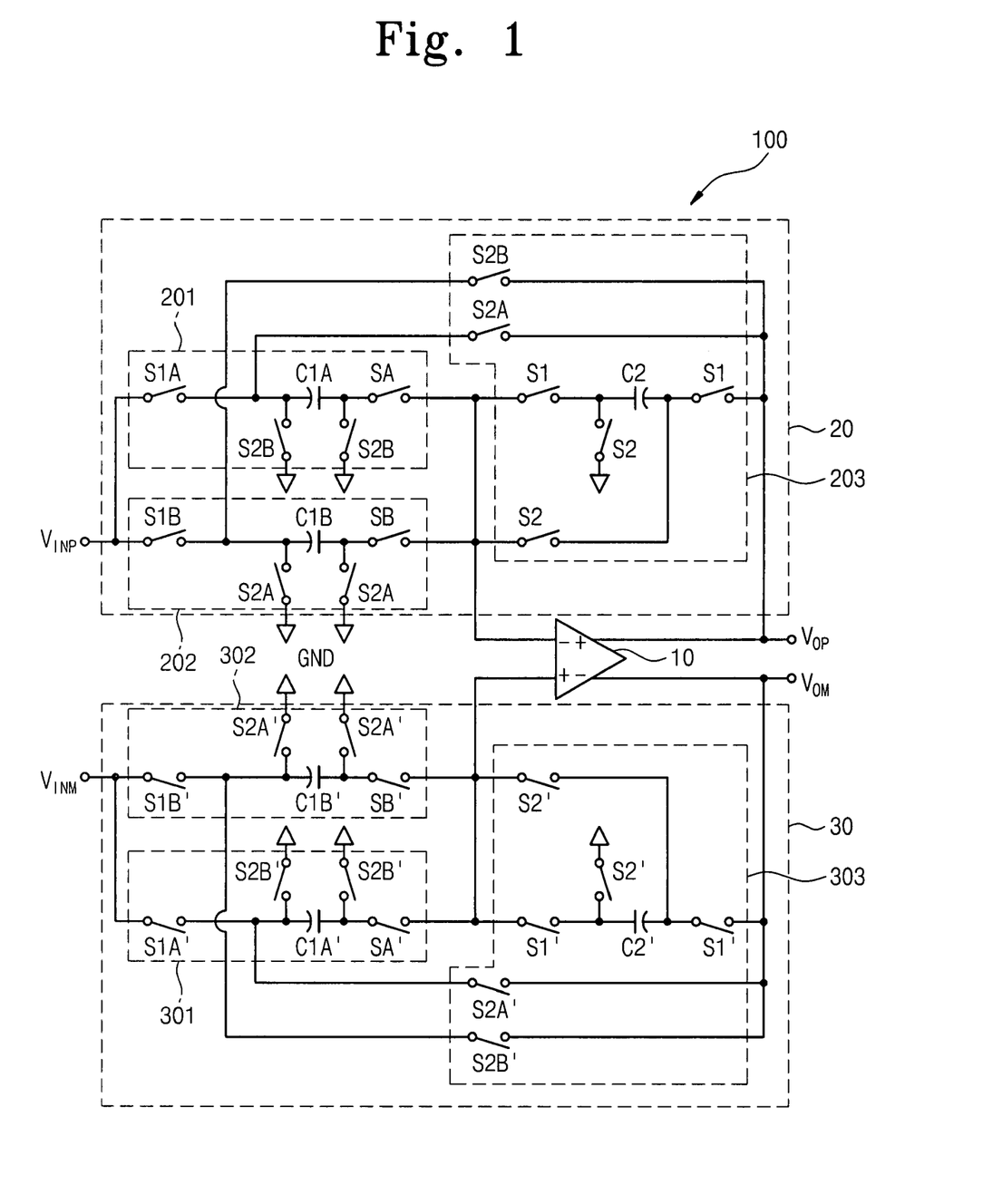
FIG. 1 is a circuit diagram of a ratio-independent switched capacitor amplifier according to some embodiments of the present invention.

FIG. 1 is a circuit diagram showing a ratio-independent switched capacitor amplifier according to some embodiments of the present invention.

Referring to FIG. 1, a ratio-independent switched capacitor amplifier 100 according to some embodiments of the present invention may include a differential amplifier circuit 10, a first sampling circuit 20, and a second sampling circuit 30.

The first sampling circuit 20 may include a first sampling part 201, a second sampling part 202, and a first feedback part 203, and the second sampling circuit 30 may include a third sampling part 301, a fourth sampling part 302, and a second feedback part 303. The first and second sampling parts 201 and 202 are activated by an input voltage $V_{INP}$ and are connected to a ground voltage GND, respectively. The third and fourth sampling parts 301 and 302 are activated by an input voltage $V_{INM}$ and are connected to a ground voltage GND, respectively. The input voltages $V_{INP}$ and $V_{INM}$ may have the same amplitude and a differential phase.

The first sampling part 201 may include a first sampling capacitor C1A (hereinafter, referred to simply as a sampling capacitor) and switches SA, S1A, and S2B, and the third sampling part 301 may include a third sampling capacitor C1A' (hereinafter, referred to simply as a sampling capacitor) and switches SA', S1A', and S2B'. The second sampling part 202 may include a second sampling capacitor C1B (hereinafter, referred to simply as a sampling capacitor) and switches SB, S1B, and S2A, and the fourth sampling part 302 may include a fourth sampling capacitor C1B' (hereinafter, referred to simply as a sampling capacitor) and switches SB', S1B', and S2A'.

The first feedback part 203 may include a first feedback capacitor C2 (hereinafter, referred to simply as a feedback capacitor) and switches S1 and S2, and the second feedback part 303 may include a second feedback capacitor C2' (hereinafter, referred to simply as a feedback capacitor) and switches S1' and S2'.

The capacitors C1A, C1A', C1B, C1B', C2, and C2' in the first and second sampling circuits 20 and 30 may have the same capacitance.

The first and second sampling circuits 20 and 30 operate in response to the input voltages $V_{INP}$ and $V_{INM}$ at the same time, respectively. Accordingly, the first and third sampling parts 201 and 301, the second and fourth sampling parts 202 and 302, and the first and second feedback parts 203 and 303 operate at the same time, respectively. Since the first and second sampling circuits 20 and 30 operate at the same time, the switches S1, S2, SA, SB, S1A, S1B, S2A, and S2B operate corresponding switches S1', S2', SA', SB', S1A', S1B', S2A', and S2B', respectively. In particular, the switches S1 and S1', switches S2 and S2', switches SA and SA', switches SB and SB', switches S1A and S1A', switches S1B and S1B', switches S2A and S2A', and switches S2B and S2B' operate at the same time, respectively.

When the first and third sampling parts 201 and 301 are activated in response to corresponding input voltages $V_{INP}$ and $V_{INM}$, respectively, the second and fourth sampling parts 202 and 302 are inactivated. When they are respectively activated by the input voltages $V_{INP}$ and $V_{INM}$, the first and third sampling parts 201 and 301 sample the corresponding input voltages $V_{INP}$ and $V_{INM}$. At this time, charge is are induced in the first and second feedback parts 203 and 303. The induced charge is identical in amount to that charged in the first and third sampling parts 201 and 301 and has an inverse polarity relative to the charges in the first and third sampling parts 201 and 301. A voltage corresponding to charge in the respective sampling parts 201 and 301 is referred to as a first sampling voltage, and a voltage corresponding to charge in the respective feedback parts 203 and 303 is referred to as a first inverted voltage.

Afterwards, the input voltage $V_{INP}$ and $V_{INM}$ are cut off, and charges stored in the respective first and second feedback parts 203 and 303 are discharged into the first and third sampling parts 201 and 301, respectively. At this time, the second and fourth sampling parts 202 and 302, which did not perform the sampling operation, may discharge any charges stored therein (e.g., from a previous sampling operation) to a ground voltage GND, respectively.

Accordingly, a double amount of charges corresponding to the input voltages $V_{INP}$ and $V_{INM}$ is charged in the first and third sampling parts 201 and 301 by means of charges provided from the first and second feedback parts 203 and 303, respectively. The first sampling voltage is thereby doubled.

The differential amplifier circuit 10 may output a difference between voltages in the first and third sampling parts 201 and 301 via its non-inverting and inverting output terminals (+, −). At this time, voltages from the differential amplifier circuit 10 are doubled as compared with a difference of the input voltages $V_{INP}$ and $V_{INM}$. That is, the ratio-independent switched capacitor amplifier 100 double amplifies a difference between the input voltages and outputs the amplified signal via the non-inverting and inverting terminals, respectively. Accordingly, the ratio-independent switched capacitor amplifier 100 may have a double gain. Signals $V_{OP}$ and $V_{OM}$ generated at the non-inverting and inverting terminals of the differential amplifier circuit 10 may have the same amplitude and a differential phase.

Following the sampling of the input voltages by the first and third sampling parts 201, 301, the second and fourth sampling parts 202 and 302 are activated in response to corresponding input voltages $V_{INP}$ and $V_{INM}$, respectively, and the first and third sampling parts 201 and 301 are inactivated. The second and fourth sampling parts 202 and 302 respectively activated by the input voltages $V_{INP}$ and $V_{INM}$ sample the corresponding input voltages $V_{INP}$ and $V_{INM}$. At this time, charge is induced in the first and second feedback parts 203 and 303. The charges induced in the first and second feedback parts 203, 303, is identical in amount to that charged in the second and fourth sampling parts 202 and 302 and has an inverse polarity relative thereto. A voltage corresponding to charges in the respective sampling parts 202 and 302 is referred to as a second sampling voltage, and a voltage corresponding to charges in the respective feedback parts 203 and 303 is referred to as a second inverted voltage.

Subsequently, the input voltages $V_{INP}$ and $V_{INM}$ are cut off, and charges in the respective first and second feedback parts 203 and 303 are discharged into the second and fourth sampling parts 202 and 302, respectively. Accordingly, a double amount of charges corresponding to the input voltages $V_{INP}$ and $V_{INM}$ is charged in the second and fourth sampling parts 202 and 302, respectively. The second sampling voltage is thereby doubled. At this time, the inactivated sampling parts 201 and 301 may discharge any charge stored therein to a ground voltage GND, respectively.

The differential amplifier circuit 10 may output a difference between voltages in the second and fourth sampling parts 202 and 302 via its non-inverting and inverting output terminals (+, −). At this time, voltages from the differential amplifier circuit 10 are doubled as compared with a difference of the input voltages $V_{INP}$ and $V_{INM}$. That is, the ratio-independent switched capacitor amplifier 100 double amplifies a difference between the input voltages and outputs the amplified signal via the non-inverting and inverting output terminals, respectively. Accordingly, the ratio-independent switched capacitor amplifier 100 may have a double gain. Signals $V_{OP}$ and $V_{OM}$ from the non-inverting and inverting terminals of the differential amplifier circuit 10 may have the same amplitude and a differential phase.

As described above, a ratio-independent switched capacitor amplifier 100 according to embodiments of the present invention may respond to first and second input voltages and may perform a first sampling operation and a first amplification operation via first and third sampling parts 201 and 301 and first and second feedback parts 203 and 303 to obtain a double gain. Charge stored in the inactivated sampling circuits 202 and 302 may be discharged to a ground voltage GND during the first amplification operation. Afterwards, the ratio-independent switched capacitor amplifier 100 responds to the first and second input voltages and performs second sampling and amplification operations via the second and fourth sampling circuits 202 and 302 and the first and second feedback parts 203 and 303 to obtain a double gain. Charge stored in inactivated sampling circuits 201 and 301 may be discharged to a ground voltage GND during the second amplification operation. The ratio-independent switched capacitor amplifier 100 may then repeat the above-described first and second sampling and amplification operations.

Accordingly, the ratio-independent switched capacitor amplifier 100 may be configured to double amplify a difference between input signals/voltages in one sampling stage and one amplification stage. The ratio-independent switched capacitor amplifier 100 uses one sampling stage and one amplification stage to double amplify a difference between input voltages/signals. This means that a ratio-independent switched capacitor amplifier 100 according to embodiments of the present invention can process input signals at a higher speeds via by using only two stages (one sampling stage and one amplification stage).

Hereinafter, a detailed operation of a ratio-independent switched capacitor amplifier according to an some embodiments of the invention will be described with reference to FIGS. 2 to 6A.

Figure 2:
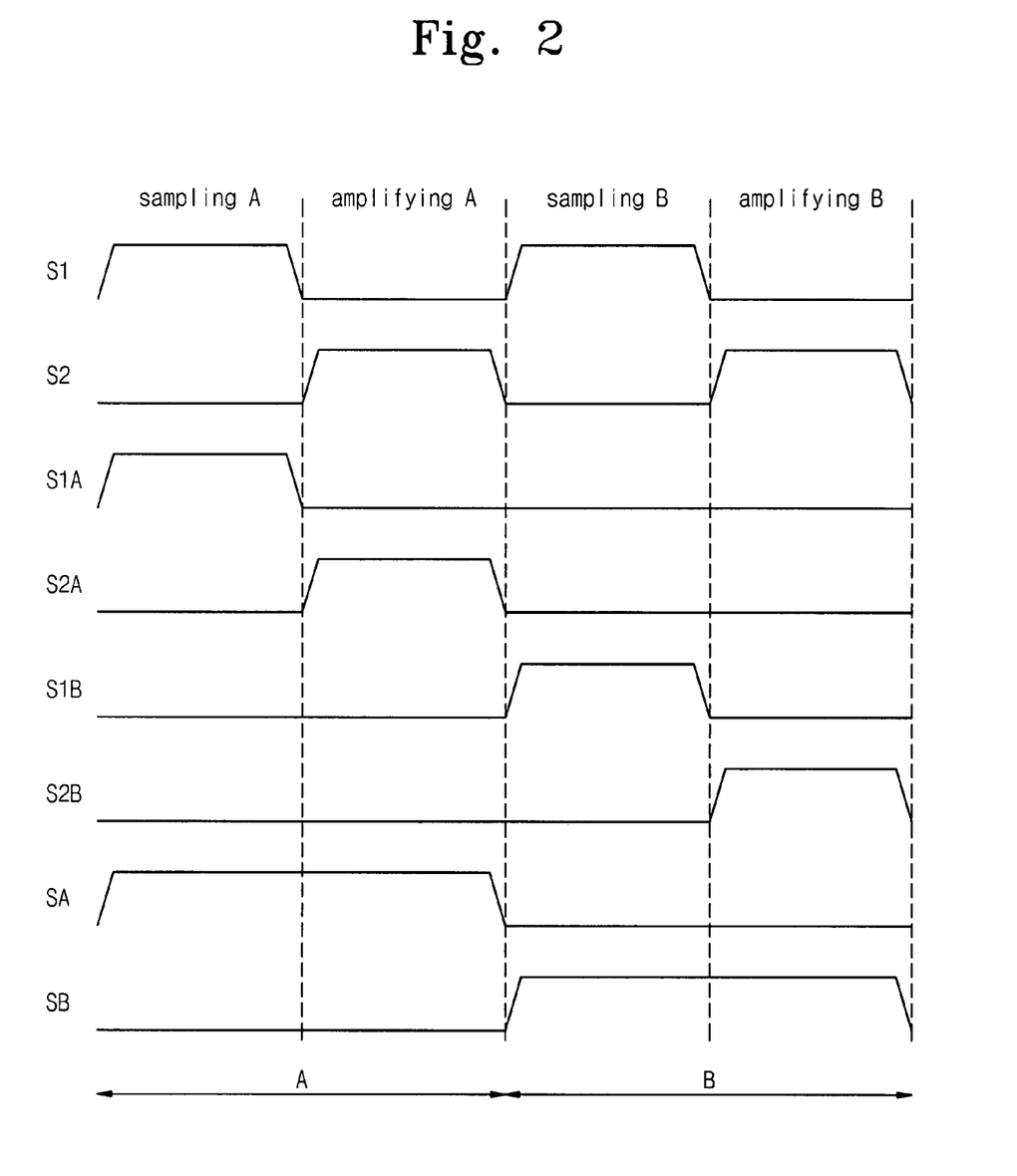
FIG. 2 is a timing diagram of a ratio-independent switched capacitor amplifier as illustrated in FIG. 1.
Figure 3:
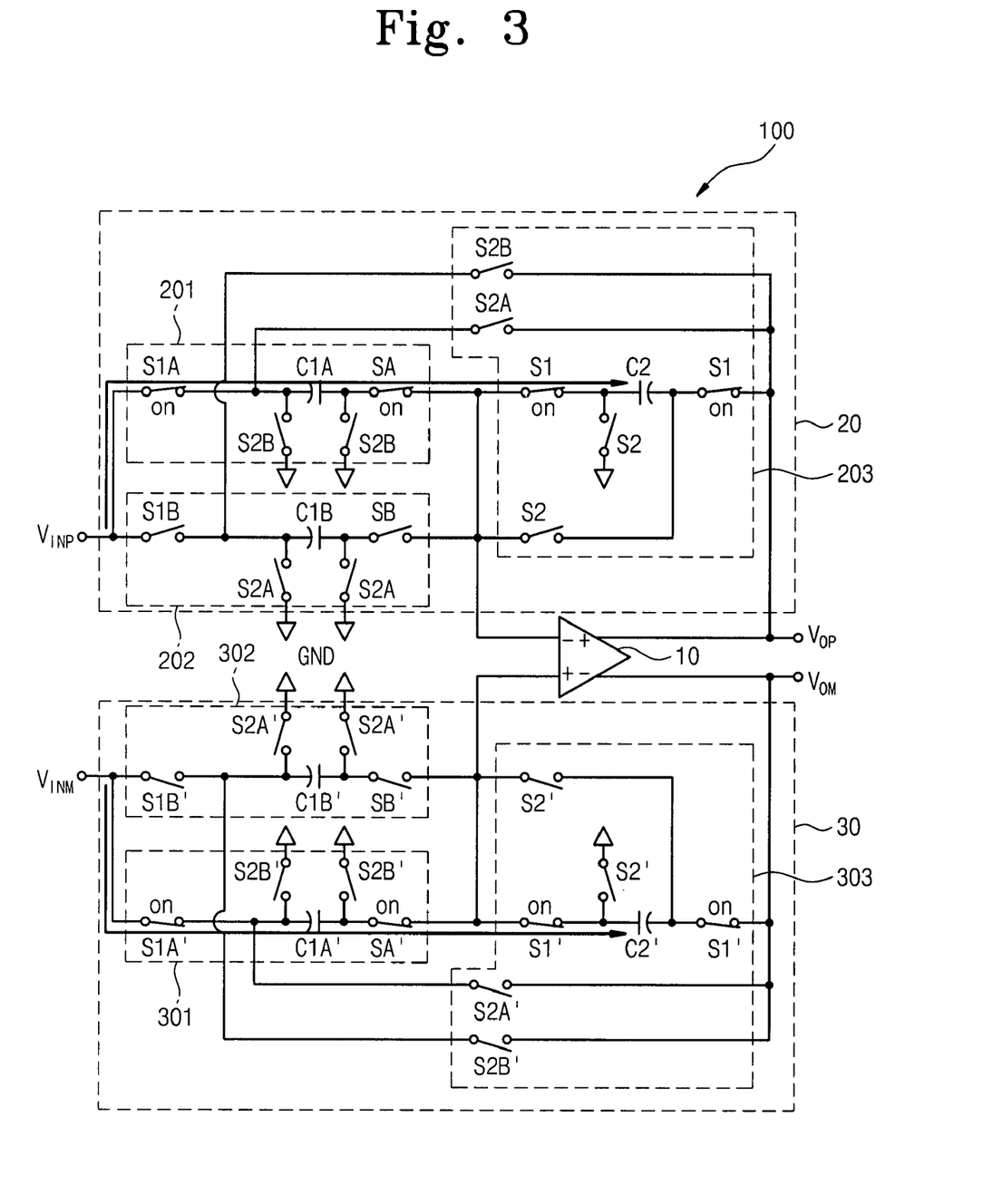
FIG. 3 is a diagram showing a switch state for describing a first sampling operation of a ratio-independent switched capacitor amplifier as illustrated in FIG. 1.
Figure 3A:
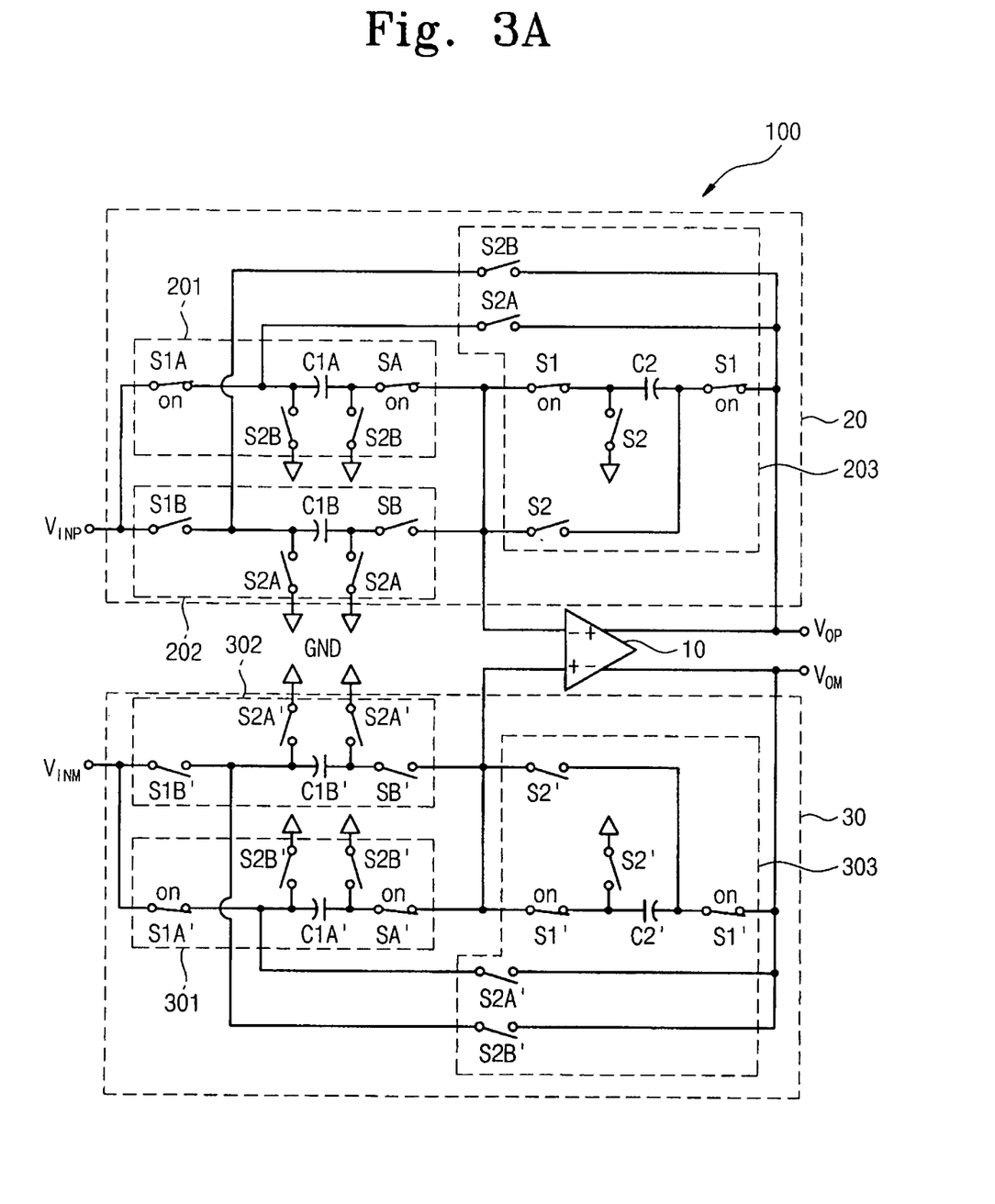
FIG. 3A is a diagram showing an equivalent circuit to the circuit shown in FIG. 3.

FIG. 2 is a timing diagram of a ratio-independent switched capacitor amplifier illustrated in FIG. 1. FIG. 3 is a diagram showing a switch state for describing a first sampling operation of a ratio-independent switched capacitor amplifier illustrated in FIG. 1. FIG. 3A is a diagram showing an equivalent circuit to the circuit shown in FIG. 3. A first sampling operation of a ratio-independent switched capacitor amplifier will be more fully described with reference to FIGS. 2, 3 and 3A.

In case of performing a sampling operation in an interval A illustrated in FIG. 2, switches S1, S1A and SA of the ratio-independent switched capacitor amplifier 100 are closed (i.e., turned on) and switches S2, SB, S1B, S2A and S2B thereof are opened (i.e., turned off). Thus, one end of a sampling capacitor C1A in a first sampling part 201 is connected to an input voltage $V_{INP}$ via a switch S1A, and the other end thereof is connected to an inverting input terminal of a differential amplifier circuit 10 via a switch SA. The other end of the sampling capacitor C1A is connected to one end of a feedback capacitor C2 in a first feedback part 203 via switches SA and S1.

The switches S1 in the first feedback part 203 are connected to both ends of the feedback capacitor C2, respectively. One end of the feedback capacitor C2 is connected to an inverting input terminal of the differential amplifier circuit 10, and the other end of the feedback capacitor C2 is connected to a non-inverting output terminal of the differential amplifier circuit 10 via the switch S1. That is, a feedback loop is formed via the feedback capacitor C2, and a node (that is, a non-inverting input terminal) becomes a virtual ground.

With this configuration, when the first sampling part 201 is activated in response to an input voltage $V_{INP}$, a charge Q1 corresponding to the input voltage $V_{INP}$ is charged in a sampling capacitor C1A of the first sampling part 201, and the feedback capacitor C2 in the first feedback part 203 is charged with an induced charge that has an opposite polarity to the charge in the sampling capacitor C1A. The induced charge in the feedback capacitor C2 of the first feedback part 203 is due to the charge Q0 in the sampling capacitor C1A of the first sampling part 201, so that the feedback capacitor C2 is charged with a charge Q2 of the same amount as Q0 in the sampling capacitor C1A by the input voltage $V_{INP}$.

If the input voltage $V_{INP}$ is a positive voltage, one end of the sampling capacitor C1A in the first sampling part 201, in which the charge Q1 is charged, becomes positive, and the other end of the sampling capacitor C1A becomes negative. Since the other end of the capacitor C1A becomes negative, the other end of the second feedback capacitor C2 becomes positive, that is, opposite to that of the other end of the sampling capacitor C1A. Since the other end of the feedback capacitor C2 in the first feedback part 203 becomes positive, one end of the feedback capacitor C2 becomes negative. Accordingly, charges in the sampling capacitor C1A of the first sampling part 201 are identical in amount to that in the feedback capacitor C2 of the first feedback part 203 and have an opposite polarity thereto.

The first and third sampling parts 201 and 301, the second and fourth sampling parts 202 and 302, and the first and second feedback parts 203 and 303 operate at the same time, respectively. Accordingly, during a first sampling operation of the ratio-independent switched capacitor amplifier 100, switches S1', S1A' and SA' are closed (i.e., turned on), and switches S2', SB', S1B', S2A' and S2B' are opened (i.e., turned off).

Charging operations of the sampling capacitor C1A' in the first sampling part 301 and of the feedback capacitor C2' in the second feedback part 303 with respect to an input voltage $V_{INM}$ in response to the turn-on/off state of the switches S1', S2', SA', SB', S1A', S1B', S2A', and S2B' in the second sampling circuit 30, are similar to those of the sampling capacitor C1A and the feedback capacitor C2 with respect to an input voltage $V_{INP}$ in response to the turn-on/off state of the switches S1, S2, SA, SB, S1A, S1B, S2A, and S2B in the first sampling circuit 20. However, since the input voltages $V_{INP}$ and $V_{INM}$ have the same amplitude and an opposite polarity, when the input voltage $V_{INP}$ is positive, the input voltage $V_{INM}$ is negative. If the input voltage $V_{INM}$ is negative, one end of the sampling capacitor C1A' in the third sampling part 301, in which the charge Q1 is charged, becomes negative, and the other end becomes positive. Since the other end of the capacitor C1A' is positive, the other end of the second feedback capacitor C2' in the second feedback part 303 becomes negative, being opposite to that of the other end of the sampling capacitor C1A'. Since the other end of the feedback capacitor C2' in the second feedback part 303 becomes negative, one end of the feedback capacitor C2' becomes positive.

Accordingly, the sampling capacitor C1A' of the third sampling part 301 is charged with the charge Q1 corresponding to the input voltage $V_{INM}$, and the feedback capacitor C2' in the second feedback part 303 is charged with a charge Q2 that is opposite in polarity to the charge Q1 in the sampling capacitor C1A' and that is identical in amount to the charge Q1 in the sampling capacitor C1A'.

Figure 4:
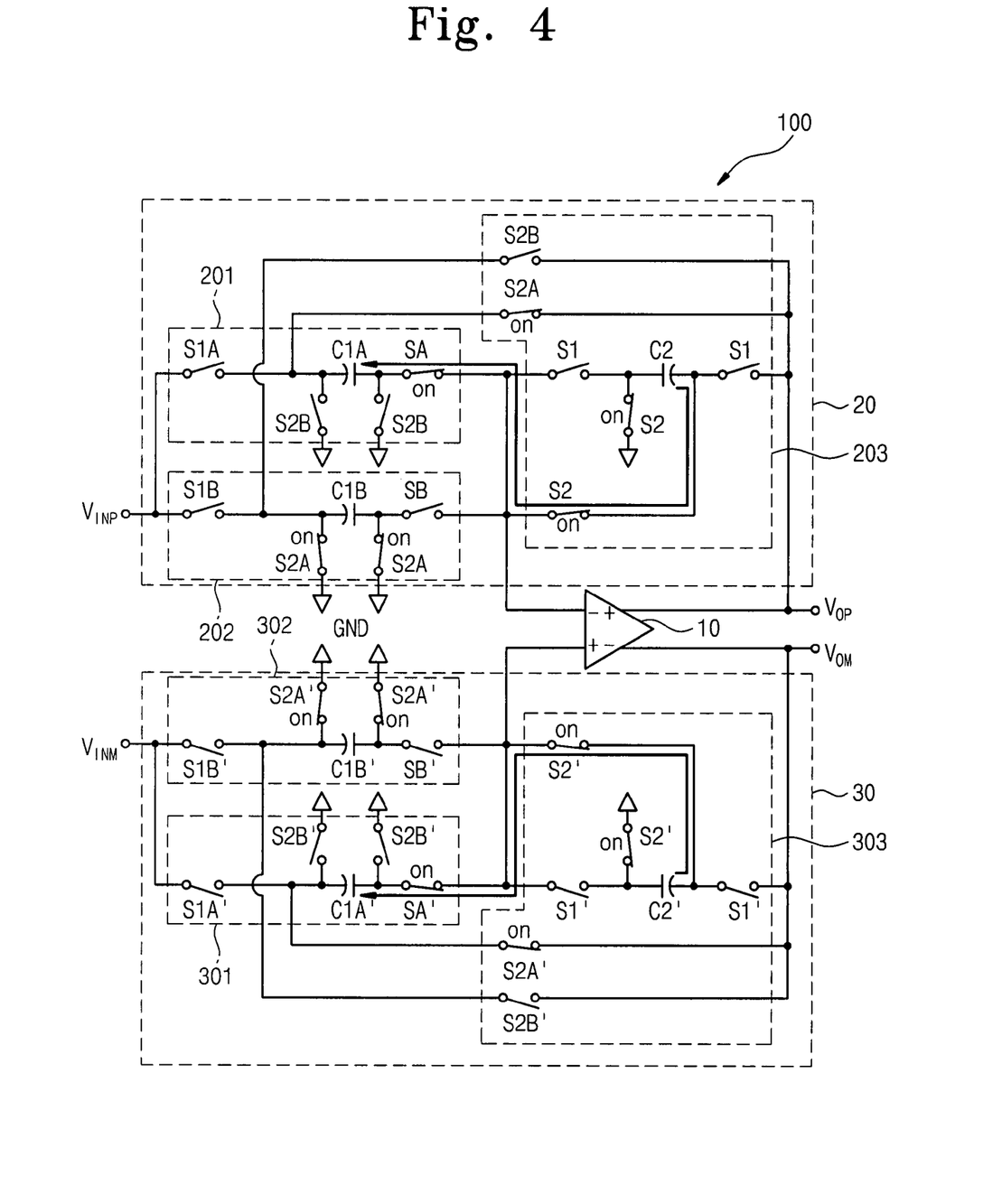
FIG. 4 is a diagram showing a switch state for describing a first amplification operation of a ratio-independent switched capacitor amplifier as illustrated in FIG. 1.
Figure 4A:
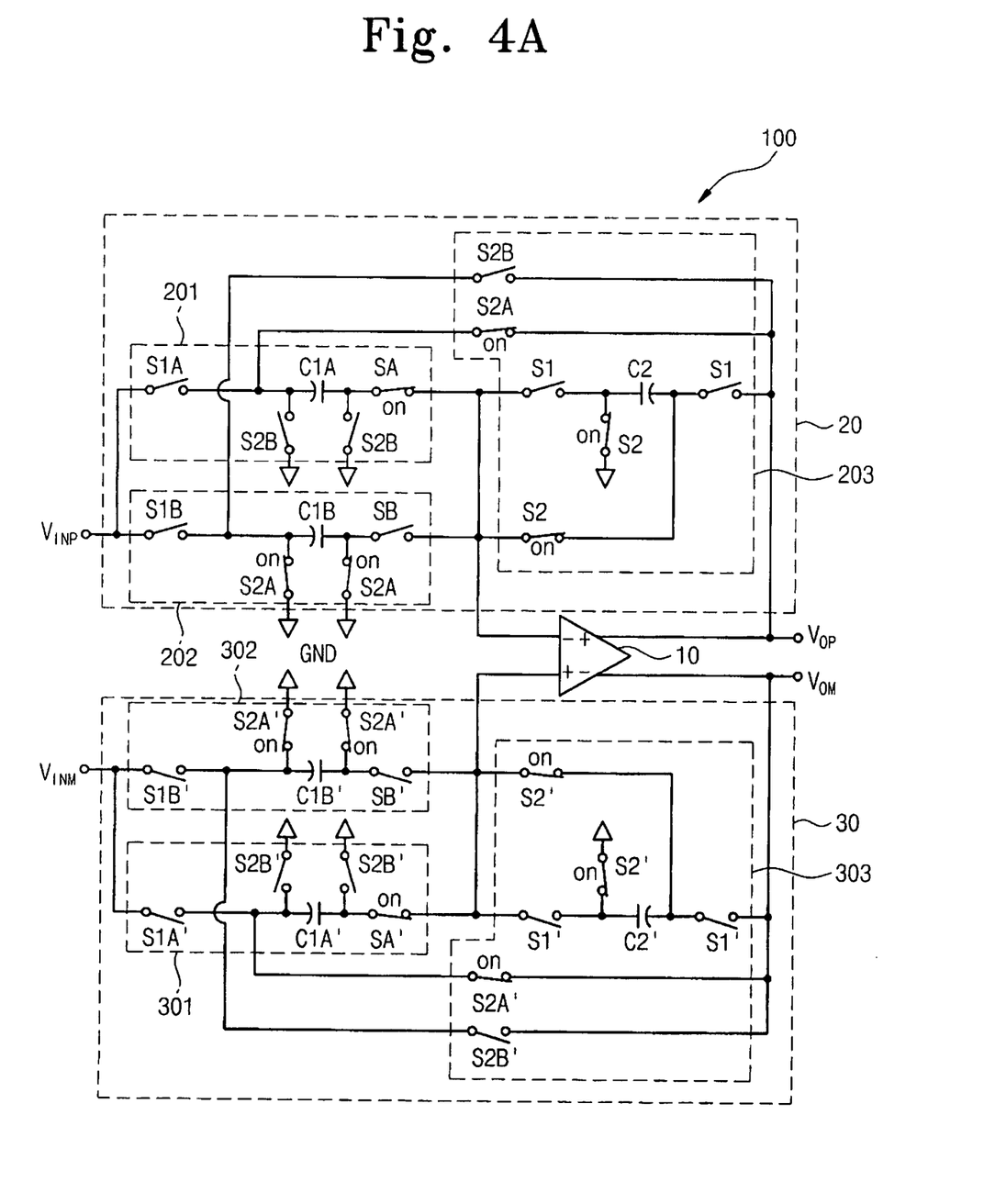
FIG. 4A is a diagram showing an equivalent circuit to the circuit shown in FIG. 4.

FIG. 4 is a diagram showing a switch state for describing a first amplification operation of a ratio-independent switched capacitor amplifier illustrated in FIG. 1. FIG. 4A is a diagram showing an equivalent circuit to the circuit shown in FIG. 4. A first amplification operation of a ratio-independent switched capacitor amplifier will be more fully described with reference to FIGS. 2, 4 and 4A.

In case of performing an amplification operation in an interval A illustrated in FIG. 2, switches S2, S2A and SA are closed (i.e., turned on), and switches S1, SB, S1A, S2B, and S1B are opened (i.e., turned off).

Accordingly, two switches S2 in the first feedback part 203 are connected to both ends of a the feedback second capacitor C2, respectively. One end of the feedback second capacitor C2 is connected to an inverting input terminal of a differential amplifier circuit 10 via the switch S2, and the other end of the feedback second capacitor C2 is connected to a ground voltage GND via the switch S2. The one end of the feedback second capacitor C2 is connected to the other end of the sampling first capacitor C1A in the first sampling part 201 via switches S2 and SA. Since one end of the sampling first capacitor C1A is connected to a non-inverting output terminal via the switch S2A and the other end of the sampling first capacitor C1A is connected to an inverting input terminal of the differential amplifier circuit 10 via the switch SA, the differential amplifier circuit 10 forms a feedback loop via the sampling first capacitor C1A. At this time, two switches S2A of the second sampling part 202 are connected to both respective ends of the sampling capacitor C1B, respectively, and both ends of the sampling capacitor C1B are connected to a ground voltage GND via switches S2A, respectively.

During the first amplification operation, the sampling first capacitor C1A of the first sampling part 201 is charged with charges that are identical in amount and have an opposite polarity as compared with the feedback second capacitor C2 of the first feedback part 203. If a case where the input voltage $V_{INP}$ is positive, one end of the sampling first capacitor C1A in the first sampling part 201 is positive and the other end thereof is negative. Accordingly, the other end of the feedback second capacitor C2 in the first feedback part 203 is positively charged, that is, opposite to that the charge of the other end of the sampling first capacitor C1A, and one end of the feedback second capacitor C2 is negative. In this case, during a first amplification operation of a ratio-independent switched capacitor amplifier 100, positive charges at the other end of the feedback second capacitor C2 are discharged to a ground voltage GND via a switch S2. Since positive charges at the other end of the feedback second capacitor C2 are discharged to a ground voltage GND via a switch S2, negative charges at one end of the feedback second capacitor C2 are discharged to the sampling first capacitor C1A of the first sampling part 201 via the switches S2 and SA. That is, negative charges at one end of the feedback second capacitor C2 are transferred to the sampling first capacitor C1A of the first sampling part 201 via the switches S2 and SA. Since the sampling first capacitor C1A is supplied with negative charges of from the feedback second capacitor C2, charges (Q1+Q2) in the sampling first capacitor C1A are doubled as compared with the charges Q0 in the sampling first capacitor C1A during a first sampling operation of the ratio-independent switched capacitor amplifier 100.

The first and third sampling parts 201 and 301, the second and fourth sampling parts 202 and 302, and the first and second feedback parts 203 and 303 operate at the same time, respectively. Accordingly, during the first amplification operation of the ratio-independent switched capacitor amplifier 100, switches S2', S2A', and SA' of the second sampling circuit 30 are closed (i.e., turned on), and switches S1', SB', S1A', S2B', and S1B' are opened (i.e., turned off).

Such an operation, in which charges discharged from the feedback capacitor C2' of the second feedback part 303 are charged in the sampling capacitor C1A' of the third sampling part 301 in accordance with the turn-on/off state of the switches S1', S2', SA', SB', S1A', S1B', S2A', and S2B' in the second sampling circuit 30, is similar to the at operation in which charges discharged from the feedback capacitor C2 of the first feedback part 203 are charged in the sampling capacitor C1A of the first sampling part 201 in accordance with the turn-on/off state of the switches S1, S2, SA, SB, S1A, S1B, S2A, and S2B in the first sampling circuit 20, although the phase is opposite.

Accordingly, since the sampling capacitor C1A' of the third sampling part 301 is charged with charges Q2' discharged from the feedback capacitor C2' of the second feedback part 303, charges (Q1'+Q2') in the sampling capacitor C1A' of the second sampling part 301 are doubled as compared with the charge Q1' in the sampling capacitor C1A' of the second sampling part 301 during the first sampling operation of the ratio-independent switched capacitor amplifier 100.

As a result, the amount of charge in sampling capacitors C1A and C1A' during the first amplification operation of the ratio-independent switched capacitor amplifier 100 is doubled as compared with the amount of charge in the sampling capacitors C1A and C1A' during the first sampling operation of the ratio-independent switched capacitor amplifier 100.

During the first amplification operation of the ratio-independent switched capacitor amplifier 100, an inverting input terminal and a non-inverting output terminal of the differential amplifier circuit 10 form a feedback loop via the sampling capacitor C1A of the first sampling part 201, and the non-inverting input terminal and the inverting output terminal form a feedback loop via the sampling capacitor C1A' of the third sampling part 301. Accordingly, the differential amplifier circuit 10 outputs a difference of voltages of the sampling capacitors C1A and C1A' to the non-inverting and inverting output terminals, respectively. At this time, a voltage from the differential amplifier circuit 10 is doubled as compared with a difference between input voltages $V_{INP}$ and $V_{INM}$. That is, the ratio-independent switched capacitor amplifier 100 double amplifies the difference between the input voltages $V_{INP}$ and $V_{INM}$ and outputs the amplified signal via the non-inverting and inverting output terminals, respectively. Accordingly, the ratio-independent switched capacitor amplifier 100 has a double gain. A signal $V_{OP}$ from the non-inverting output terminal has the same amplitude and an opposite phase as compared with a signal $V_{OM}$ from the inverting output terminal.

The ratio-independent switched capacitor amplifier 100 double amplifies a difference between input voltages/signals via one sampling operation and one amplification operation within an interval A illustrated in FIG. 2. In order to double amplify a difference between input voltages/signals, the amplifier 100 uses one sampling operation and one amplification operation. This means that since a double gain is obtained through two stages, it is possible in some embodiments to process input signals at a higher speeds than conventional switched capacitor amplifiers.

After the first amplification operation, the ratio-independent switched capacitor amplifier 100 repeats the above-described sampling and amplification operations. However, since the sampling capacitors C1A and C1A' are charged at the conclusion of the first amplification operation, the charge in the sampling capacitors C1A and C1A' may be discharged before the sampling and amplification operations can be carried out again using the sampling capacitors C1A and C1A'.

Accordingly, during the first amplification operation in interval A, the ratio-independent switched capacitor amplifier 100 discharges charges in the sampling capacitor C1B of the second sampling part 202 to a ground voltage GND via a switch S2A and charges in the sampling capacitor C1B' of the fourth sampling part 302 to a ground voltage GND via a switch S2A'. Afterwards, during a second sampling operation of the amplifier 100, the sampling capacitors C1B and C1B', which were discharged during the first amplification operation of the amplifier 100, may be used. This will be more fully described hereinafter.

Figure 5:
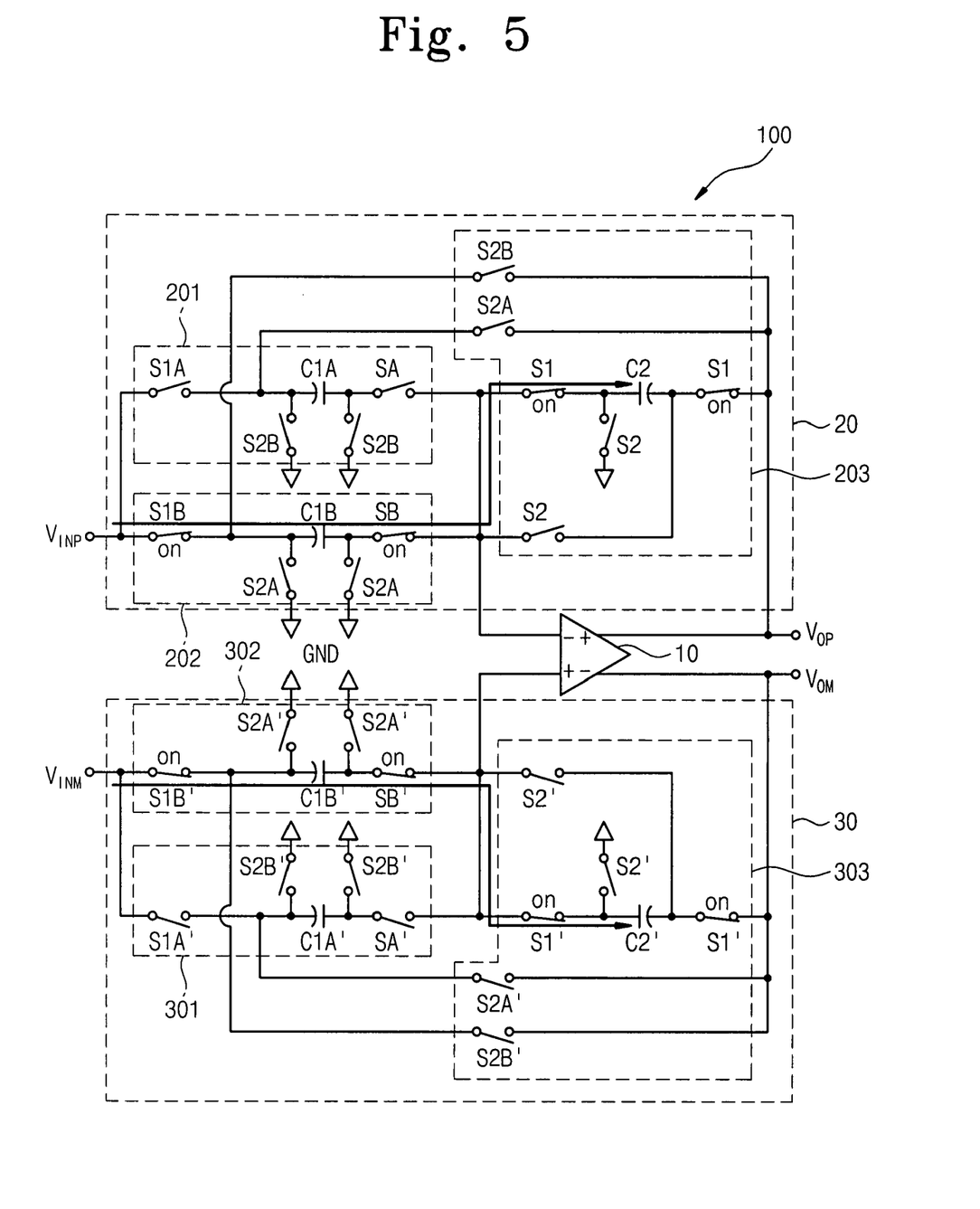
FIG. 5 is a diagram showing a switch state for describing a second sampling operation of a ratio-independent switched capacitor amplifier as illustrated in FIG. 1.
Figure 5A:
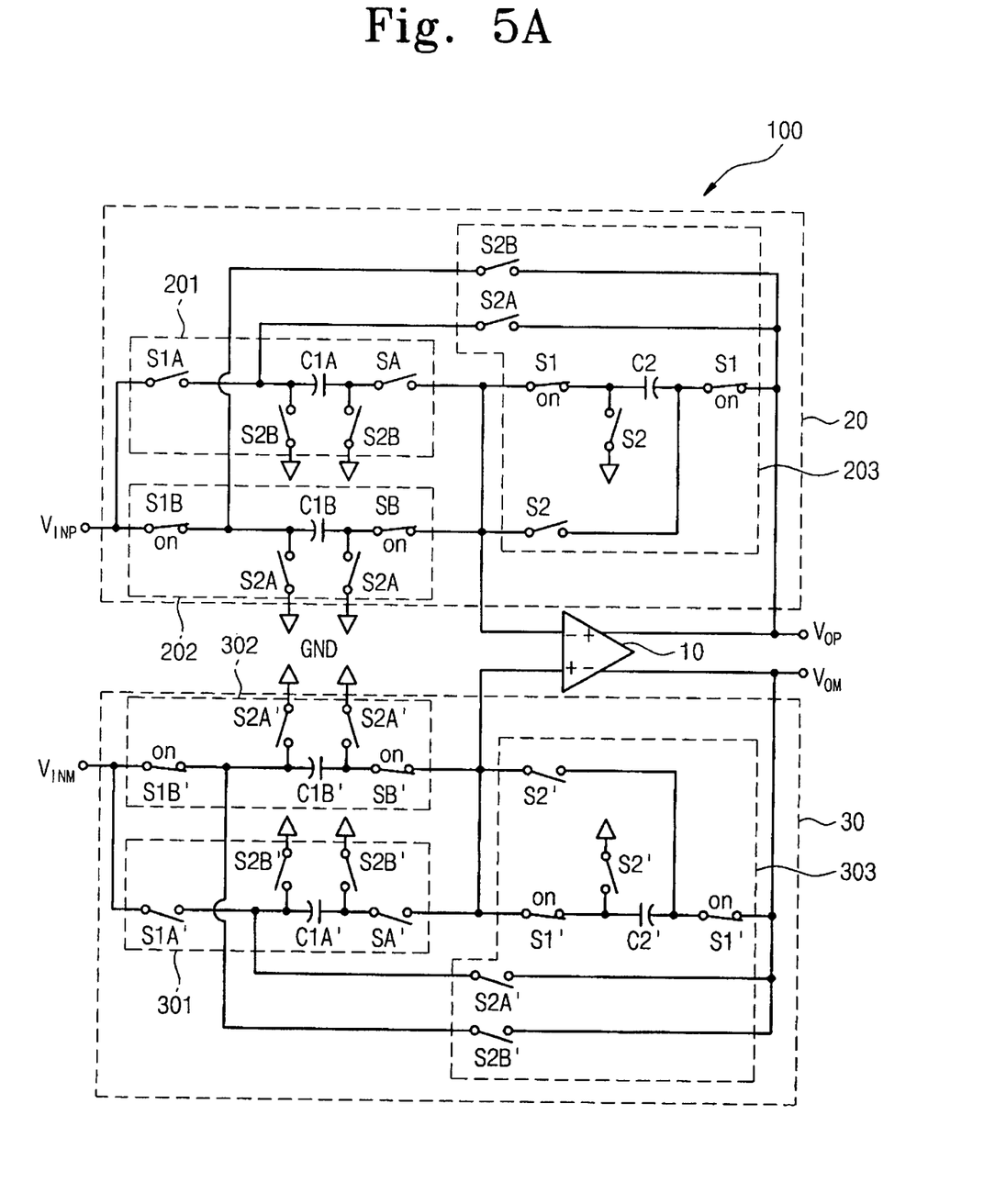
FIG. 5A is a diagram showing an equivalent circuit to the circuit shown in FIG. 5.

FIG. 5 is a diagram showing a switch state for describing a second sampling operation of a ratio-independent switched capacitor amplifier illustrated in FIG. 1. FIG. 5A is a diagram showing an equivalent circuit to the circuit shown in FIG. 5. A second sampling operation of a ratio-independent switched capacitor amplifier will be more fully described with reference to FIGS. 2, 5 and 5A.

In case of performing a second sampling operation in an interval BA illustrated in FIG. 2, switches S1, S1B and SB of the ratio-independent switched capacitor amplifier 100 are closed (i.e., turned on) and switches S2, SA, S1A, S2A and S2B thereof are opened (i.e., turned off). Thus, one end of a sampling first capacitor C1BA in a second sampling part 202 is connected to an input voltage $V_{INP}$ via a switch S1B, and the other end thereof is connected to an inverting input terminal of a differential amplifier circuit 10 via a switch SB. The other end of the sampling capacitor C1B is also connected to one end of a feedback second capacitor C2 in a first feedback part 203 via switches SB and S1. The switches S1 in the first feedback part 203 are connected to both respective ends of a the feedback second capacitor C2, respectively. One end of the feedback second capacitor C2 is connected to a non-inverting output terminal of the differential amplifier circuit 10 via a switch S1, and the other end of the feedback second capacitor C2 is connected to an inverting input terminal of the differential amplifier circuit 10 via the switch S1. That is, a feedback loop is formed via the feedback second capacitor C2, and a node (that is, a non—the inverting input terminal) becomes a virtual ground. With this configuration, when the second sampling part 202 is activated in response to an input voltage $V_{INP}$, a charges Q1 corresponding to the input voltage $V_{INP}$ is charged in a the sampling first capacitor C1B of the second sampling part 202, and the feedback second capacitor C2 in the first feedback part 203 is charged with an induced charges that have has an opposite polarity to that the charged Q1 in the sampling first capacitor C1B. The induced charges in the second feedback capacitor C2 of the first feedback part 203 is due to the charges Q1 in the sampling first capacitor C1B, so that the feedback second capacitor C2 is charged with the charges Q2 of the same amount as that of Q1 charged in the sampling first capacitor C1B by the input voltage $V_{INP}$.

In the event that if the input voltage $V_{INP}$ is a positive voltage, one end of the sampling first capacitor C1B in the second sampling part 202, in which the charges Q1 is charged, becomes positive, and the other end of the sampling first capacitor C1B becomes negative. Since the other end of the sampling capacitor C1B becomes negative, the other end of the feedback second capacitor C2 in the first feedback part 203 becomes positive, that is, opposite to that of the other end of the sampling capacitor C1B. Since the other end of the feedback second capacitor C2 becomes positive, one end of the feedback second capacitor C2 becomes negative. Accordingly, charges in the sampling first capacitor C1B of the second sampling part 202 are identical in amount to that in the feedback capacitor C2 of the first feedback part 203 and have an opposite polarity thereto.

The first and third sampling parts 201 and 301, the second and fourth sampling parts 202 and 302, and the first and second feedback parts 203 and 303 operate at the same time, respectively. Accordingly, during a second sampling operation of the ratio-independent switched capacitor amplifier 100, switches S1', S1B' and SB' are closed (i.e., turned on), and switches S2', SA', S1A', S2A' and S2B' are opened (i.e., turned off).

Charging operations of the sampling capacitor C1B' in the fourth sampling part 302 and of the feedback capacitor C2' in the second feedback part 303 with respect to an input voltage $V_{INM}$ at turn-on/off of switches S1', S2' SA', SB', S1A', S1B', S2A', and S2B' in the second sampling circuit 30 are similar to those of the sampling capacitor C1B of the second sampling part 202 and the feedback capacitor C2 of the second feedback part 203 with respect to an input voltage $V_{INP}$ in response to the turn-on/off of switches S1, S2, SA, SB, S1A, S1B, S2A, and S2B in the first sampling circuit 20. However, since the input voltages $V_{INP}$ and $V_{INM}$ have the same amplitude and an opposite polarity, when the input voltage $V_{INP}$ is positive, the input voltage $V_{INM}$ is negative. If the input voltage $V_{INM}$ is negative, one end of the sampling capacitor C1A' in the fourth sampling part 302, in which the charge Q1 is charged, becomes negative, and the other end thereof becomes positive. Since the other end of the sampling capacitor C1A' is positive, the other end of the second feedback capacitor C2' in the second feedback part 303 becomes negative, being opposite to that of the other end of the sampling capacitor C1A'. Since the other end of the feedback capacitor C2' in the second feedback part 303 becomes negative, one end of the feedback capacitor C2' becomes positive.

Accordingly, the sampling capacitor C1B' of the fourth sampling part 302 is charged with a charge Q1' corresponding to the input voltage $V_{INM}$, and the feedback capacitor C2' in the second feedback part 303 is charged with a charge Q2' that is opposite in polarity to the charge in the sampling capacitor C1B' and is identical in amount to the charge in the sampling capacitor C1B'.

Figure 6:
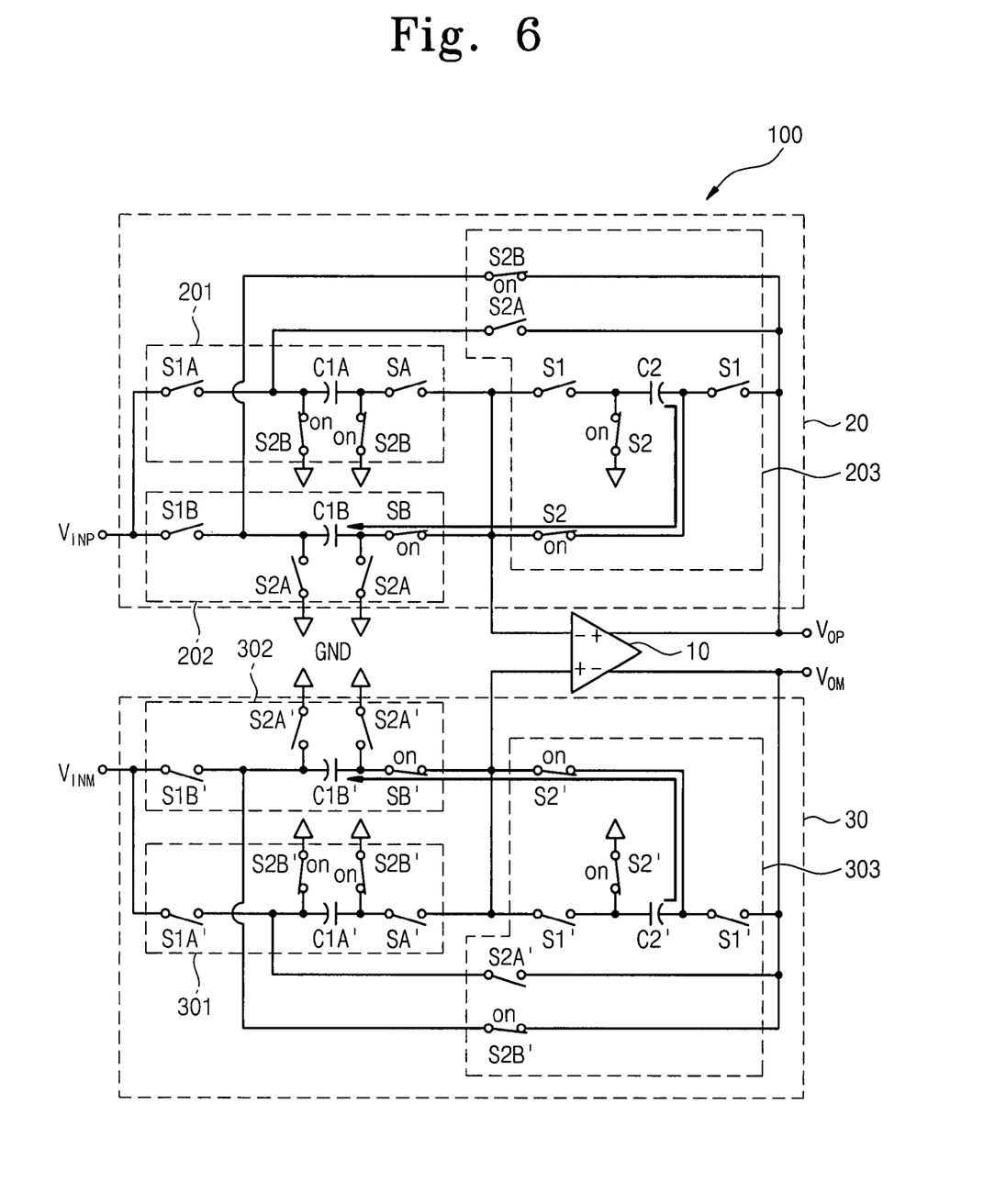
FIG. 6 is a diagram showing a switch state for describing a second amplification operation of a ratio-independent switched capacitor amplifier as illustrated in FIG. 1.
Figure 6A:
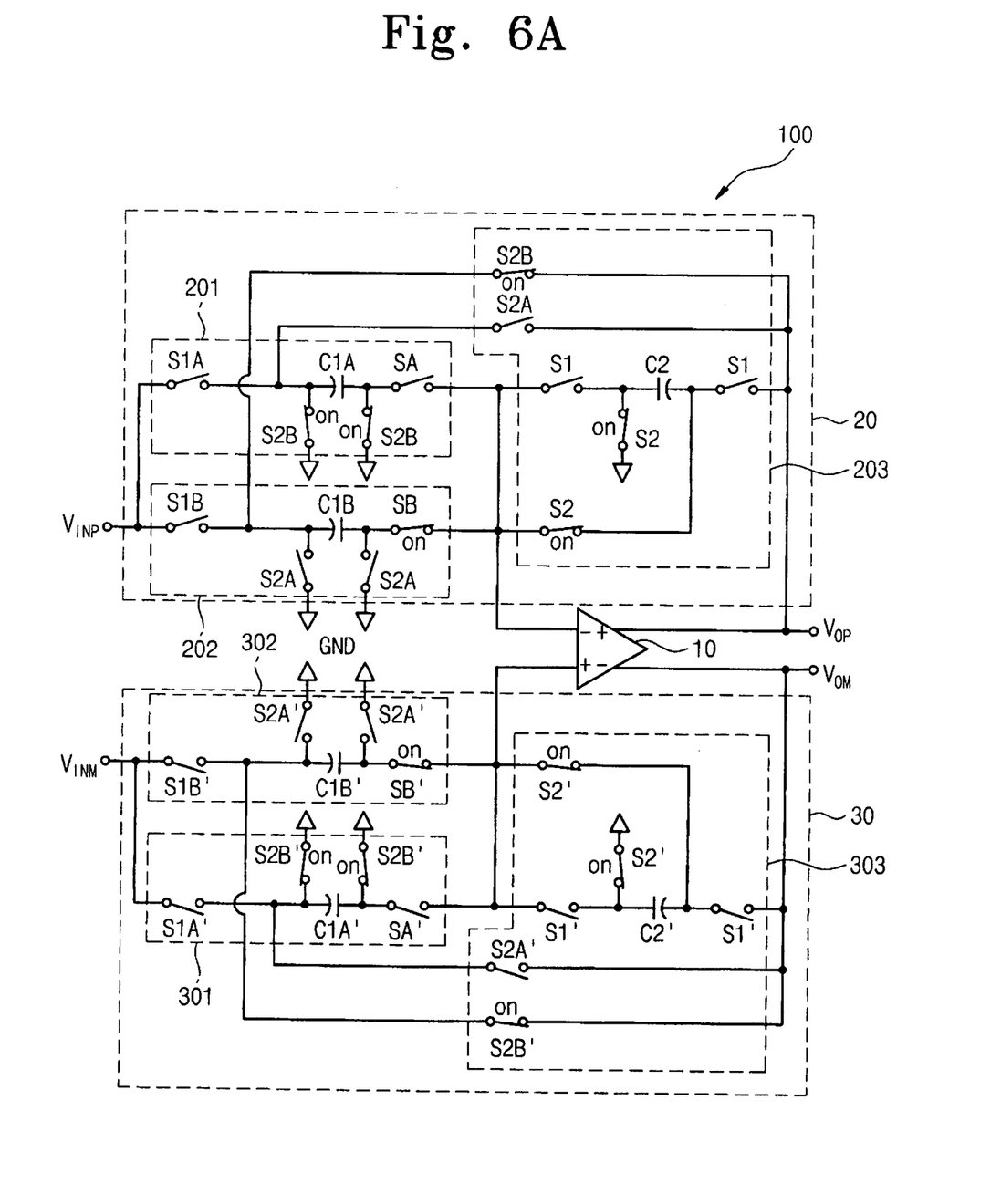
FIG. 6A is a diagram showing an equivalent circuit to the circuit shown in FIG. 6.

FIG. 6 is a diagram showing a switch state for describing a second amplification operation of a ratio-independent switched capacitor amplifier illustrated in FIG. 1. FIG. 6A is a diagram showing an equivalent circuit to the circuit shown in FIG. 6. A second amplification operation of a ratio-independent switched capacitor amplifier will be more fully described with reference to FIGS. 2, 6 and 6A.

When performing an a second amplification operation in an interval B illustrated in FIG. 2, switches S2, S2B and SB are closed (i.e., turned on), and switches S1, SA, S1A, S2A, and S1B are opened (i.e., turned off).

Accordingly, two switches S2 in a first feedback part 203 are connected to both ends of a feedback second capacitor C2, respectively. One end of the feedback second capacitor C2 is connected to an inverting input terminal of a differential amplifier circuit 10 via the switch S2, and the other end of the feedback second capacitor C2 is connected to a ground voltage GND via the switch S2. One end of the feedback second capacitor C2 is connected to the other end of the sampling capacitor C1B in the second sampling part 202 via switches S2 and SB. Since one end of the sampling capacitor C1B of the second sampling part 202 is connected to a non-inverting output terminal via the switch S2B and the other end of the sampling capacitor C1B is connected to an inverting input terminal of the differential amplifier circuit 10 via the switch SB, the differential amplifier circuit 10 forms a feedback loop via the sampling capacitor C1B. At this time, two switches S2B of the first sampling part 201 are connected to both ends of the sampling capacitor C1A, respectively, and both ends of the capacitor C1A are connected to a ground voltage GND via switches S2B, respectively.

During the second sampling operation of the ratio-independent switched capacitor amplifier 100, the sampling first capacitor C1B of the second sampling part 202 is charged with a charges that are is identical in amount and have has an opposite polarity as compared with the feedback second capacitor C2 of the first feedback part 203. In a case where If the input voltage $V_{INP}$ is positive, one end of the sampling first capacitor C1B is positive and the other end thereof is negative. Accordingly, the other end of the feedback second capacitor C2 in the first feedback part 203 is positive that is opposite to that of the other end of the sampling first capacitor C1B, and one end of the feedback second capacitor C2 is negative.

In this case, during a second amplification operation of the ratio-independent switched capacitor amplifier 100, positive charges at the other end of the feedback second capacitor C2 in the first feedback part 203 are discharged to a ground voltage GND via a switch S2. Since positive charges at the other end of the feedback second capacitor C2 are discharged to a ground voltage GND via a switch S2, negative charges at one end of the feedback second capacitor C2 are discharged to the sampling second capacitor C1B of the second sampling part 202 via the switches S2 and SB. That is, negative charges at one end of the feedback second capacitor C2 are transferred to the sampling first capacitor C1B of the second sampling part 202 via the switches S2 and SB. Since the sampling first capacitor C1B of the second sampling part 202 is supplied with negative charges of the feedback second capacitor C2, the charges (Q1+Q2) in the sampling first capacitor C1B are is doubled as compared with the charges Q1 in the sampling first capacitor C1B during a the second sampling operation of the ratio-independent switched capacitor amplifier 100.

The first and third sampling parts 201 and 301, the second and fourth sampling parts 202 and 302, and the first and second feedback parts 203 and 303 operate at the same time, respectively. Accordingly, during the second amplification operation of the ratio-independent switched capacitor amplifier 100, switches S2', S2A', and SA' are closed (i.e., turned on), and switches S1', SB', S1A', S2B', and S1B' are opened (i.e., turned off).

Such an operation, in which that the charge Q2' discharged from the feedback capacitor C2' of the second feedback part 303 is charged into the sampling capacitor C1B' of the fourth sampling part 302 in accordance with the turn-on/off state of the switches S1', S2', SA', SB', S1A', S1B', S2A', and S2B' in the second sampling circuit 30, is similar to the operation in which the charge Q2 discharged from the feedback capacitor C2 of the first feedback part 203 is charged into the sampling capacitor C1B of the second sampling part 202 in accordance with the turn-on/off state of the switches S1, S2, SA, SB, S1A, S1B, S2A, and S2B in the first sampling circuit 20, although the phase is opposite. Accordingly, since the sampling capacitor C1B' of the fourth sampling part 302 is charged with charges Q2' discharged from the feedback capacitor C2' of the second feedback part 303, the charge (Q1'+Q2') in the sampling capacitor C1B' is doubled as compared with the charge Q1' in the sampling capacitor C1B' during the second sampling operation of the ratio-independent switched capacitor amplifier 100.

An amount of charge in the sampling capacitors C1B and C1B' during the second amplification operation of the ratio-independent switched capacitor amplifier 100 is doubled as compared with an amount of charge in the sampling capacitors C1B and C1B' during the second sampling operation of the ratio-independent switched capacitor amplifier 100.

During the second amplification operation of the ratio-independent switched capacitor amplifier 100, an inverting input terminal and a non-inverting output terminal of the differential amplifier circuit 10 form a feedback loop via the sampling capacitor C1B of the second sampling part 202, and a non-inverting input terminal and an inverting output terminal form a feedback loop via the sampling capacitor C1B' of the fourth sampling part 302. Accordingly, the differential amplifier circuit 10 outputs a difference of voltages of the sampling capacitors C1B and C1B' to the non-inverting and inverting output terminals, respectively. At this time, a voltage from the differential amplifier circuit 10 is doubled as compared with a difference between input voltages $V_{INP}$ and $V_{INM}$. That is, the ratio-independent switched capacitor amplifier 100 double amplifies the difference between the input voltages $V_{INP}$ and $V_{INM}$ and outputs the amplified signal via the non-inverting and inverting output terminals, respectively. Accordingly, the ratio-independent switched capacitor amplifier 100 has a double gain. A signal $V_{OP}$ from the non-inverting output terminal has the same amplitude and an opposite phase as compared with a signal $V_{OM}$ from the inverting output terminal.

During the second amplification operation, the ratio-independent switched capacitor amplifiercation 100 discharges charge stored in the sampling capacitor C1A of the first sampling part 201 to a ground voltage GND via switches S2B and charge stored in the sampling capacitor C1A' of the third sampling part 301 to a ground voltage GND via switches S2A'.

Accordingly, the ratio-independent switched capacitor amplifier 100 double amplifies a difference between input voltages/signals via one sampling operation and one amplification operation within an interval B illustrated in FIG. 2. In order to double amplify a difference between input voltages/signals, the amplifier 100 uses one sampling operation and one amplification operation. This means that since a double gain is obtained through two stages, it is possible to process input signals at high speeds.

As a result, the ratio-independent switched capacitor amplifier 100 obtains a double gain by performing sampling and amplification operations using sampling capacitors C1A and C1A' and feedback capacitors C2 and C2'. The ratio-independent switched capacitor amplifier 100 discharges sampling capacitors C12B and C12B' to a ground voltage GND while an amplification operation is carried out by use of the sampling capacitors C1A and C1A' and the feedback capacitors C2 and C2'. At a next stage, the ratio-independent switched capacitor amplifier 100 obtains a double gain by performing sampling and amplification operations using the sampling capacitors C12B and C12B' and the feedback capacitors C2 and C2', which are discharged. The ratio-independent switched capacitor amplifier 100 discharges the sampling capacitors C1A and C1A' to a ground voltage GND while an amplification operation is carried out by use of the sampling capacitors C12B and C12B' and the feedback capacitors C2 and C2'. Afterwards, the ratio-independent switched capacitor amplifier 100, as illustrated in FIG. 2, repeats sampling and amplification operations within intervals A and B.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A ratio-independent switched capacitor amplifier comprising:
   a first sampling circuit configured to sample a first input voltage as a first sampling voltage and to double a level of the first sampling voltage after sampling thereof;
   a second sampling circuit configured to sample a second input voltage as a second sampling voltage and to double a level of the second sampling voltage after sampling thereof; and
   a differential amplifier circuit configured to output a difference between the doubled first sampling voltage and the doubled second sampling voltage;
   wherein the first sampling circuit is electrically connected to the differential amplifier during a sampling operation.

2. The ratio-independent switched capacitor amplifier of claim 1, wherein the second input voltage has the same amplitude and an opposite phase as the first input voltage, wherein the first and second sampling circuits are configured to perform a sampling operation at the same time.

3. The ratio-independent switched capacitor amplifier of claim 1, wherein the first sampling circuit comprises:
   a first sampling part configured to sample the first input voltage;
   a second sampling part configured to sample the first input voltage during an inactive interval of the first sampling part; and
   a first feedback part configured to generate a first inverse voltage, having the same amplitude and an opposite phase as the first sampling voltage, during a sampling operation of either of the first and second sampling parts,
   wherein the first feedback part is electrically connected to the differential amplifier during the sampling operation and is configured to provide the first inverse voltage to one of the first and second sampling parts during a cut-off interval of the first input voltage.

4. The ratio-independent switched capacitor amplifier of claim 3, wherein the first sampling part is configured to double a level of the first sampling voltage in response to the first inverse voltage provided from the first feedback part.

5. The ratio-independent switched capacitor amplifier of claim 3, wherein the second sampling part is configured to double a level of the first sampling voltage in response to the first inverse voltage provided from the first feedback part.

6. The ratio-independent switched capacitor amplifier of claim 3, wherein the second sampling part is configured to discharge charge stored therein to a ground voltage when the first sampling part is provided with the first inverse voltage from the first feedback part.

7. The ratio-independent switched capacitor amplifier of claim 3, wherein the first sampling part is configured to discharge charge stored therein to a ground voltage when the second sampling part is provided with the first inverse voltage from the first feedback part.

8. The ratio-independent switched capacitor amplifier of claim 3, wherein the first and second sampling parts are configured to be activated sequentially.

9. The ratio-independent switched capacitor amplifier of claim 1, wherein the second sampling circuit comprises:
   a third sampling part configured to sample the second input voltage;
   a fourth sampling part configured to sample the second input voltage during an inactive interval of the third sampling part; and
   a second feedback part configured to generate a second inverse voltage, having the same amplitude and an opposite phase as the second sampling voltage, during a sampling operation of either of the third and fourth sampling parts,
   wherein the second feedback part is electrically connected to the differential amplifier during the sampling operation and is configured to provide the second inverse voltage to one of the third and fourth sampling parts during an cut-off interval of the second input voltage.

10. The ratio-independent switched capacitor amplifier of claim 9, wherein the third sampling part is configured to double a level of the second sampling voltage in response to the second inverse voltage provided from the second feedback part.

11. The ratio-independent switched capacitor amplifier of claim 9, wherein the fourth sampling part is configured to double a level of the second sampling voltage in response to the second inverse voltage provided from the second feedback part.

12. The ratio-independent switched capacitor amplifier of claim 9, wherein the fourth sampling part is configured to discharge charge stored therein to a ground voltage when the third sampling part is provided with the second inverse voltage from the second feedback part.

13. The ratio-independent switched capacitor amplifier of claim 9, wherein the third sampling part is configured to discharge charge stored therein to a ground voltage when the fourth sampling part is provided with the second inverse voltage from the second feedback part.

14. The ratio-independent switched capacitor amplifier of claim 9, wherein the third and fourth sampling parts are configured to be activated sequentially.

15. A method of operating a ratio-independent switched capacitor amplifier, comprising:
sampling a first input voltage as a first sampling voltage by a first sampling circuit;
sampling a second input voltage as a second sampling voltage by a second sampling circuit;
doubling a level of the first sampling voltage during an interval in which the first input voltage is cut off by the first sampling circuit;
doubling a level of the second sampling voltage during an interval in which the second input voltage is cut off by the first sampling circuit; and
outputting a difference between the first sampling voltage and the second sampling voltage by a differential amplifier,
wherein the first sampling circuit is electrically connected to the differential amplifier during the sampling of the first input voltage as the first sampling voltage by the first sampling circuit.

16. The method of claim 15, wherein the second input voltage has the same amplitude and an opposite phase as the first input voltage.

17. The method of claim 15, wherein sampling the first input voltage and sampling the second input voltage are carried out at the same time, and doubling a level of the first sampling voltage and doubling a level of the second sampling voltage are performed at the same time.

18. The method of claim 15, further comprising generating a first inverse voltage that has the same amplitude and an opposite phase as the first input voltage.

19. The method of claim 18, wherein doubling a level of the first sampling voltage comprises feeding back the first inverse voltage to double a level of the first sampling voltage.

20. The method of claim 15, wherein sampling the first input voltage comprises sequentially activating first and second sampling parts.

21. The method of claim 20, wherein charges stored in an inactivated one of the first and second sampling parts are discharged to a ground voltage.

22. The method of claim 15, wherein sampling the second input voltage comprises sampling a second inverse voltage that has the same amplitude and an opposite phase as the second input voltage.

23. The method of claim 15, wherein doubling a level of the second sampling comprises feeding back the second inverse voltage to double a level of the second sampling voltage.

24. The method of claim 15, wherein sampling the second input voltage comprises sequentially activating third and fourth sampling parts.

25. The method of claim 24, wherein charges in an inactivated one of the third and fourth sampling parts are discharged to a ground voltage.

* * * * *